United States Patent Office 3,513,317

Patented May 19, 1970

3,513,317

HIGH-IMPEDANCE PHOTOSENSITIVE DEVICES COMPRISING ELECTRODES OF POLYOLEFIN OXIDE

Albert Edward Binks, Limerick, Pa., and Allan Sharples, Edinburgh, Scotland, assignors to Ilford Limited, Essex, England, a British company No Drawing. Filed June 21, 1968, Ser. No. 738,867
Claims priority, application Great Britain, June 21, 1967, 28,727/67; July 31, 1967, 35,029/67
Int. Cl. H01j *39/12;* H01b *1/00;* H01c *1/00*
U.S. Cl. 250—211 6 Claims

ABSTRACT OF THE DISCLOSURE

This application describes a photosensitive device which comprises a photosensitive element, which is either a photosensitive substance or a photosensitive junction, having attached thereto electrodes the improvement which comprises providing that the electrodes are composed of a polyolefin oxide which is composed of units of the general formula:

$$-\left[(CH_2)_n-O\right]-$$

where *n* is 2, 3 or 4.

The present invention relates to photosensitive devices.

Many photosensitive devices exist and are well known in industry, for example photocells, photo-multipliers and other similar devices. In all such devices, the electrical response of some substance, or of, for example, a semi-conducting junction is changed if the device is subjected to photon radiation. The term "photo-sensitive" is used herein to embrace all such devices.

Photosensitive devices can be divided into three main classes:

(1) Those employing a photovoltaic junction, such as that formed between copper and cuprous oxide, when light falling on the junction generates an electric potential across the junction, (2) Those containing photoconductive substances, such as selenium, the conductivity of which increases when light falls upon them, and (3) Those containing photoemissive substances, for example, thin magnesium films, which emit electrons when photons of sufficient energy strike them.

In the construction of a usable photosensitive device, electrical connection must be made to the photosensitive element by means of suitable electrodes. These electrodes should, in use, generate as little electrical noise as possible, but also make sufficient electrical contact with the photosensitive element.

In the past, this problem has been, at least in part, solved by the deposition of thin metal films as electrodes onto the photosensitive element. However, these metal films may also be photosensitive (photo-emissive) and where the photosensitive element is to be treated with high-energy photons, the masking effect of such a metal film may become so large that the photoelectric effect due to the photosensitive element is obscured.

It has been found that this problem may be overcome by the use of suitable non-photosensitive electrodes.

According to the present invention, therefore, there is provided a photosensitive device which comprises a photosensitive element, which is either a photosensitive substance or a photosensitive junction, having attached thereto electrodes which are composed of a polyolefin oxide which is composed of units of the general formula:

$$-\left[(CH_2)_n-O\right]-$$

where *n* is 2, 3 or 4.

The polyolefin oxide should be selected to have a conductivity of the order of $10^{-9}$ ohm$^{-1}$ cm.$^{-1}$. Polyethylene oxide, polytrimethylene oxide and polytetramethylene oxide all satisfy this condition. Of these three polymers, polyethylene oxide is preferred. Polymethylene oxide has a much lower conductivity, generally less than $10^{-17}$ ohm$^{-1}$ cm.$^{-1}$ and is unsuitable.

Electrodes of these polymeric materials have the great advantage that they are not photosensitive (the dark and light conductivities of such materials are identical), and neither do they inject charge carriers into the photosensitive substances or junction under the action of light. Their properties are therefore unaffected by incident photons. The presence of water in the olefin oxide polymer is not required for realising the electrical conductivity necessary for the purpose of the present invention. The polyethylene oxides used in the present invention are capable of being formed into translucent films covering a photosensitive substance or junction, thus minimising the effect of the electrode on the photons incident on the photosensitive device.

Electrical connection must, of course, also be made to the electrodes themselves. This is preferably achieved by deposition of a metal-containing conductive layer onto the polymer surface, or a layer of a metal itself. This layer may be, for example, an evaporated silver or aluminum film, or a coating of "Silver Dag," this last being preferred. It is necessary that the secondary deposited film electrode is shielded from photon radiation. Electrical connection to such an electrode may be effected by any suitable method.

The photosensitive substance used in photosensitive devices according to the present invention may be any such substance conventionally employed.

Photosensitive devices according to the present invention may also be constructed in order to determine properties of the photosensitive material itself. For example a photosensitive device comprising a body of a photosensitive highly insulative polymeric material, such as poly-N-vinyl carbazole having dispersed on each side thereof an electrode comprising a deposited layer of a polyolefin oxide, may be used to determine the photoelectric properties of the polymeric material.

According to a specific feature of the present invention, there are provided devices comprising an electric circuit wherein a radiation-sensitive component, the electric behaviour of which depends on its exposure to electromagnetic radiation, is connected to the circuit by means of a low-ohmic radiation-transmitting electrode consisting of polyalkylene oxide.

The following example will serve to illustrate this aspect of the invention.

EXAMPLE

A photocell was built up from a round slice of poly-N-vinyl carbazole 25$\mu$ thick having a diameter of 32 m., pressed between two polyethylene oxide slices. The elements were held together by a spring exerting a pressure of 150 g. per sq. cm. The photocell was then placed in an electrical circuit.

The photoconductive properties of the photocell were obtained by exposing one side of it to light from a mercury vapour lamp of 125 watt of which the outer glass jacket has been removed. By means of interference filters arranged between the photocell and the lamp monochromatic light beams were obtained. The intensity of the light at wavelengths of 5460 and 3650 Angstrom was about $1.5\times10^{15}$ photons $sec.^{-1}$ $cm.^{-2}$.

During the exposure of one side of the photocell to the light a direct current potential of 120 v. was applied to the photocell, the negative pole of the direct current source being connected to the exposed side of the photocell. The photoelectric current was noted 15 minutes after the beginning of the exposure.

The current values recorded are shown in the following table.

| Wavelength in Angstrom of light used for the exposure: | Photoelectric current in amperes |
|---|---|
| 5,460 | $2.10^{-12}$ |
| 3,650 | $9.10^{-12}$ |
| 2,540 | $4.10^{-12}$ |
| Dark current (stationary value) | $5.10^{-13}$ |

The present invention encompasses not only photosensitive devices as described above, but also a method of testing the photoelectric properties of a material of high resistivity as just described.

We claim as our invention:

1. In a photosensitive device which comprises a photosensitive element, which is either a photosensitive substance or a photosensitive junction, having attached thereto electrodes the improvement which comprises providing that the electrodes are composed of a polyolefin oxide which is composed of units of the general formula:

$$\left[-(CH_2)_n-O-\right]$$

where $n$ is 2, 3 or 4.

2. A photosensitive device according to claim 1 wherein the polyolefin oxide is polyethylene oxide.

3. A photosensitive device according to claim 1 wherein the polyolefin oxide electrodes are present on the photosensitive element as a translucent film.

4. A photosensitive device according to claim 1 wherein electrical connection is made to the polyolefin oxide electrodes by means of a metal or metal-containing conductive layer deposited on the polyolefin oxide electrode, which layer is shielded from photon radiation.

5. Devices comprising an electric circuit wherein a radiation-sensitive component, the electric behaviour of which depends on its exposure to electromagnetic radiation, is connected to the circuit by means of a low-ohmic radiation-transmitting electrode consisting of polyalkylene oxide.

6. A method of testing the photoconductivity of a photosensitive highly insulative polymeric material which comprises forming a photocell wherein a section of the photosensitive material has attached on either side thereof an electrode composed of a polyolefin oxide composed of units of the general formula:

$$\left[-(CH_2)_n-O-\right]$$

wherein $n$ is 2, 3 or 4, placing the photocell in an electrical circuit, exposing one side of the cell to light of a known wavelength, applying a direct current voltage to the photocell, the negative pole of the direct current source being connected to the exposed side of the cell and noting the photoelectric current being passed in the circuit.

References Cited

UNITED STATES PATENTS 3,379,527 4/1968 Corrsin et al. ______ 250—211 X

RALPH G. NILSON, Primary Examiner

T. N. GRIGSBY, Assistant Examiner

U.S. Cl. X.R.

252—500